United States Patent
Jung et al.

(10) Patent No.: US 10,591,553 B2
(45) Date of Patent: Mar. 17, 2020

(54) CIRCUIT ARRANGEMENT AND METHOD FOR ESTABLISHING COMPATIBILITY BETWEEN A FIELD DEVICE AND A DIAGNOSTIC SYSTEM

(71) Applicant: PEPPERL + FUCHS GmbH, Mannheim (DE)

(72) Inventors: Martin Jung, Bobenheim-Roxheim (DE); Peter Ball, Mannheim (DE)

(73) Assignee: PEPPERL + FUCHS GMBH, Mannheim (DE)

( * ) Notice: Subject to any disclaimer, the term of this patent is extended or adjusted under 35 U.S.C. 154(b) by 1370 days.

(21) Appl. No.: 14/268,035

(22) Filed: May 2, 2014

(65) Prior Publication Data

US 2014/0327447 A1    Nov. 6, 2014

(30) Foreign Application Priority Data

May 3, 2013   (EP) ..................................... 13166484

(51) Int. Cl.
  *G01R 31/02*   (2006.01)
  *G01R 31/50*   (2020.01)
  *G05B 19/042*  (2006.01)

(52) U.S. Cl.
  CPC ......... *G01R 31/50* (2020.01); *G05B 19/0423* (2013.01); *G05B 2219/25428* (2013.01);
  (Continued)

(58) Field of Classification Search
  CPC ...... G05B 19/4185; G05B 2219/25428; G05B 2219/31121; G05B 2219/31211; G05B 19/042
  See application file for complete search history.

(56) References Cited

U.S. PATENT DOCUMENTS 5,970,430 A * 10/1999 Burns ................ G05B 19/0425
                                                    700/117
6,564,268 B1 * 5/2003 Davis ................ G05B 19/0423
                                                    379/229
(Continued)

FOREIGN PATENT DOCUMENTS

CN         1653399 A       8/2005
DE   102006020070 A1      10/2007
(Continued)

OTHER PUBLICATIONS

Application No. CN 2014101851881, Office Action dated May 5, 2016, pp. 18.
(Continued)

*Primary Examiner* — Lee E Rodak
*Assistant Examiner* — Adam S Clarke
(74) *Attorney, Agent, or Firm* — Hoffman Warnick LLC

(57) ABSTRACT

The invention relates to a circuit arrangement for establishing compatibility between a field device or an interface device for a field device and a diagnostic system pertaining to a control system, to the output of which the interface device or field device can be connected. The diagnostic system is adapted to send, via the output of the control system, a test signal to the interface device or field device and to emit an error signal when an electrical response at the output of the control system lies outside an expectancy range. The circuit arrangement comprises voltage influencing means for influencing a voltage at the output of the control system. The circuit arrangement is characterized in that the voltage influencing means comprises a controllable power source with which power source a current can be produced for influencing a voltage at the output of the control system, that electronic analyzing and controlling means are present to identify a test signal at the output of the control system, that the analyzing and controlling means are
(Continued)

adapted, on identification of a test signal, to instruct the controllable power source to adjust a target voltage at the output of the control system, which target voltage is to be within the expectancy range. Additionally, the invention relates to a corresponding method for establishing compatibility.

10 Claims, 3 Drawing Sheets

(52) U.S. Cl.
CPC ............... *G05B 2219/31121* (2013.01); *G05B 2219/33331* (2013.01)

(56) References Cited

U.S. PATENT DOCUMENTS

| | | | |
|---|---|---|---|
| 7,181,367 B2 | 2/2007 | Saito et al. | |
| 7,282,928 B1* | 10/2007 | Hladky | G01N 17/02 |
| | | | 204/404 |
| 2002/0167904 A1 | 11/2002 | Borgeson et al. | |
| 2007/0124111 A1* | 5/2007 | Rogoll | H04L 1/20 |
| | | | 702/182 |
| 2010/0169816 A1* | 7/2010 | Hammer | G05B 19/0428 |
| | | | 715/771 |
| 2012/0299601 A1* | 11/2012 | Kitchener | H02H 9/008 |
| | | | 324/537 |
| 2013/0103877 A1* | 4/2013 | Burr | G05B 19/042 |
| | | | 710/315 |
| 2014/0032171 A1* | 1/2014 | Falk | G08B 29/046 |
| | | | 702/182 |
| 2017/0276702 A1* | 9/2017 | Freer | G01R 31/282 |

FOREIGN PATENT DOCUMENTS

| | | | | |
|---|---|---|---|---|
| DE | 102010044186 A1 * | 5/2012 | ......... | G05B 23/0221 |
| DE | 102011075764 A1 | 11/2012 | | |
| EP | 1403745 A2 | 3/2004 | | |

OTHER PUBLICATIONS

Application No. EP 13166484, Search Report, dated Oct. 18, 2013, 2 pages.

* cited by examiner

CIRCUIT ARRANGEMENT AND METHOD FOR ESTABLISHING COMPATIBILITY BETWEEN A FIELD DEVICE AND A DIAGNOSTIC SYSTEM

TECHNICAL FIELD

The present invention relates to a circuit arrangement for establishing compatibility between a field device or an interface device for a field device and a diagnostic system pertaining to a control system, to the output of which the interface device or field device can be connected. The invention also relates to an appropriate method for establishing compatibility. The diagnostic system may also be denoted as a diagnostic device.

RELATED ART

The control system can for example be a programmable logic controller (PLC). This makes use of a diagnostic system for monitoring the control circuit, that is to say, the connected devices. More particularly, diagnostic functions are used on applications complying with safety integrity level 3 (SIL3).

In the case of a generic circuit arrangement, the diagnostic system is adapted to send, via the output of the control system, a test signal to the interface device or field device and to emit an error signal when an electrical response at the output of the control system lies outside an expectancy range. The circuit arrangement comprises a voltage influencing system for influencing a voltage at the output of the control system.

The test signal can for example be in the form of a change in the voltage output at the output or alternatively a current impulse. A connected field device can effect an electric response, that is, more particularly, a voltage response or alternatively a current response. This is intended to signify that the voltage at the output or a current passing between the two electric terminals of the output is influenced by the field device. The diagnostic system checks whether this response lies within an expectancy range, that is to say, within a voltage expectancy range and/or a current expectancy range. In addition, it may be required that the expectancy range be achieved within a specified period of time after initiation of the test signal.

In the case of a generic method for establishing compatibility between a field device or an interface device for a field device and a diagnostic system of a control system, the diagnostic system emits, via the output of the control system, a test signal to the interface device or field device and emits an error signal when an electric response at the output of the control system lies outside an expectancy range, wherein a voltage at the output of the control system is influenced by means of a voltage influencing system.

The field device can be, for example, an electric load or a comparatively simple electric component. These can include, inter alia, valves or relays. These simple loads produce a voltage response at the output of the control system, which response can be correctly interpreted by existing diagnostic systems. For this reason, the diagnostic systems can in the case of these simple loads correctly emit an error signal if the connected field device is not authorized or is not functioning properly.

Frequently, however, more complex field devices or even interface devices are connected to the output of the control system. An interface device serves to connect the control system to a field device. For example, it can be a valve driver. More particularly, tests on such interface devices or field devices frequently fail when using conventional diagnostic systems.

Nevertheless, in order to make it possible to use such interface devices or field devices with the control system, the diagnostic system is conventionally frequently deactivated. The drawback of this solution is that the safety measures of the control system are not observed, i.e. the safety measures of the control system are dispensed with.

For this reason, it is desirable to establish compatibility between as many arbitrary interface devices or field devices as possible and the test performed by the diagnostic system.

For the purpose of establishing compatibility, prior circuit arrangements include the aforementioned voltage influencing system that is adapted to influence a voltage at the output of the control system.

In the prior art, the voltage influencing system can comprise, for example, a branch circuit extending parallel to a connectable interface device or field device at the output of the control system. A low-impedance load is incorporated in this branch circuit. This can establish compatibility in the case of specific static tests of the diagnostic system. In a static test, the voltage response following the test signal is evaluated at the output of the control system. In this case, the period of time that is necessary for the voltage response to set in is disregarded. For example the test signal is a test current of predetermined intensity. The diagnostic system then checks whether the drop in voltage caused by the test current is within a specified expectancy range.

The aforementioned low-impedance load can carry the test current to the diagnostic system when the connected interface device or field device is switched off. By this means, a voltage response can be produced in this switched-off state which is within the expectancy range of the diagnostic system. This avoids the generation of an error signal. The lower the impedance of the load, however, the higher the energy losses in the switched-on state of the interface device or field device. As a result, the resistance value of the load cannot be arbitrarily low. If the diagnostic system expects a load of very low impedance, it is not possible to establish compatibility. Thus such voltage influencing systems can establish compatibility with only a few diagnostic systems.

It is also known to connect, as a voltage influencing system, a circuit for discharging the line capacity to the output of the control system. Such a circuit is suitable for establishing compatibility with certain dynamic tests of some diagnostic systems. In the case of dynamic tests, the temporal course of the voltage response is taken into account.

The aforementioned circuit discharges the capacity of the line at the output when the interface device or field device is switched off. To this end, the output can be short-circuited by a resistance of, say, 500 Ohms. By this means, the voltage level at the output quickly falls and can lie within the voltage expectancy range after a short period of time. The circuit thus avoids the erroneous output of an error signal in this case. Since the resistance may not be arbitrarily small, however, the discharge of the line capacity cannot take place as quickly as desired. For some dynamic tests the line capacity is therefore not discharged in a timely manner. The case may arise that the drop in voltage caused by the resistance may lead to a voltage that is outside the voltage expectancy range. For this reason, compatibility is achieved only with specific dynamic tests of diagnostic systems. Also, as a rule no compatibility with static tests is provided in this way.

Some diagnostic systems emit an error signal when the drop in voltage in the switched-off state of the interface device or field device exceeds as little as 0.6 V. In this case, even rectifiers, reverse-connect protection diodes, or other pn-junctions connected to the output of the control system, can emit an error message. In such cases, in particular, the voltage influencing systems described above are not suitable.

Even when the two voltage influencing systems that have been described for the static test and for the dynamic test are combined, it is only possible to establish compatibility with comparatively few tests pertaining to diagnostic systems.

SUMMARY

The present invention provides a circuit arrangement and a method that make it possible to establish compatibility between a field device or an interface device and as many different diagnostic systems pertaining to a control system as possible.

Embodiments of the circuit arrangement of the invention and the method of the invention are further explained in the following description.

In a circuit arrangement as described above, provision is made, according to the present invention, for the voltage influencing system to have a controllable current source, by means of which current can be produced to influence a voltage at the output of the control system, and for electronic analyzing and controlling means to be available and configured so as to identify a test signal at the output of the control system and when such a test signal has been identified, to instruct the controllable current source to adjust a target voltage at the output of the control system, such a target voltage being within the expectancy range.

According to the present invention, in a method as described above, provision is made to the effect that the voltage influencing system has a controllable current source, that a test signal at the output of the control system is identified by electronic analyzing and controlling means, and that, once such a test signal has been identified, the analyzing and controlling means triggers, instructs or controls the controllable current source to adjust, produce or set a target voltage at the output of the control system, which target voltage is to be within the expectancy range.

According to the present invention, a test signal from the diagnostic system is measured and the voltage influencing system is controlled in accordance with this measurement. In this way, it is advantageously possible to distinguish between different test signals. For each test signal it is possible to produce or adjust a suitable voltage at the output of the control system. As a result, the erroneous production of an error signal can be avoided for many distinct test signals.

To this end, according to the invention, a controllable electric current source is used. This can produce a current passing between the two terminals at the output of the control system. In this way, the voltage at the output is modified. Since the magnitude of the current provided by the current source can be variably determined, an advantageous variable influence on the voltage at the output is made possible.

In order to influence the voltage in a way suitable for the diagnostic system, the analyzing and controlling means identifies the test signal of the diagnostic system.

In principle, the test signal may be any change in voltage and/or current. When identifying a test signal, the temporal course of this voltage and/or current change can also be taken into account.

Thus, in order to identify a test signal, the electronic analyzing and controlling means can measure a voltage and/or current at the output of the control system. At the same time the temporal course of the change in voltage and/or current can be measured.

The electronic analyzing and controlling means can be configured such that they identify a test signal based on a measurement of a current intensity, a change in current intensity, a voltage level, and/or a change in voltage level at the output of the control system. Compared with conventional voltage influencing systems, this avoids influencing the voltage at the output of the control system in the case when no test is being carried out.

Using the electronic analyzing and controlling means, a result of the measurement can be evaluated according to predefined criteria, in order to distinguish between different kinds of test signal. The criteria can include values for, or changes in, the voltage and/or the current, as well as variations thereof over time. This embodiment utilizes the finding that with different tests of diagnostic systems, it is not only the case that the voltage expectancy ranges differ, but also that different test signals are emitted that can be distinguished with reference to certain criteria.

The electronic analyzing and controlling means can have a list of different criteria, stored in non-volatile memory. For each criterion there is stored information on how the electric current source is to be controlled.

The electronic analyzing and controlling means may be configured to trigger the production or adjustment of different intensities and/or durations of a current produced by the electric current source for different kinds of test signal. In this way, it is possible to choose among different voltage values at the output of the control system. More particularly, the electric current source therefore can be controlled in different ways depending on the criteria already mentioned.

In order to achieve compatibility with a large number of different diagnostic systems, the electronic analyzing and controlling means may be adapted such that they can simultaneously recognize a number of different kinds of test signals, and that they can instruct or trigger the electric current source depending on the simultaneously recognized test signals. For example, a course of current and/or voltage at the output of the control system can be configured such that the emission of error signals does not take place for static tests nor for dynamic tests.

The criteria of the electronic analyzing and controlling means by means of which a test signal is identified can be varied. In this way the circuit arrangement of the invention can also be implemented for future tests. Furthermore, it is possible to refine criteria, should that be necessary.

To this end, the electronic analyzing and controlling means can comprise a microcontroller, by means of which the criteria to identify a test signal can be configured in a variable manner. Additionally, using the microcontroller, the voltage level and/or the duration of a current generated by the electric current source can be configured in a variable manner. This further increases the flexibility. The circuit arrangement can have connection ports, to which input devices can be connected, by means of which devices a user can provide new criteria to the microcontroller. The input device can be, for example, a computer adapted to establish a wireless or cable connection to the circuit arrangement.

In place of a microcontroller, the circuit arrangement can alternatively be constructed with the aid of discrete parts. This can reduce manufacturing costs and, potentially, the error rate.

Some interface and field devices are recognized correctly by the diagnostic system when they are switched on, but not when switched off. In this event, in particular, the electronic analyzing and controlling means are designed such that they can identify that a connected interface device or field device is switched off and that they instruct the controllable current source to adjust a target voltage and/or to produce a current of a predetermined magnitude when a connected interface device or field device has been identified as being switched off. Thus the instruction to the electric current source does not occur with every identification of a test signal, but only when the interface device or field device is additionally switched off. Provision may also be made to the effect that, depending on the type of identified test signal, a connected interface device or field device must additionally be switched off in order to allow instructions to be passed to the current source.

The manner of the supply of energy to the electronic analyzing and controlling means is basically arbitrary. In particular, means for connecting a cable for energy supply or a battery can be provided. The electronic analyzing and controlling device, however, may be adapted to draw energy for controlling the controllable current source from the voltage that is emitted by the control system at its output. More particularly, current impulses from test signals may also be used for energy supply purposes. An electrical storage unit may also be provided, which can be charged by way of the output of the control system. This storage unit can be, say, a capacitor, a super capacitor or an electrochemical accumulator.

In principle, the circuit arrangement can function as a component of any arbitrary appliance, as long as it is disposed or can be disposed between a diagnostic system of a control system and a field device to be monitored. As such, the circuit arrangement can, for example, be rigidly connected to the control system or to a field device.

The circuit arrangement may be a component that is independent of the control system and of the field devices and can be connected between them. To this end, the invention also relates to an interface device adapted to connect a field device to a control system, which interface device has a first means of connection to establish an electrical connection to a control system and a second means of connection to establish an electrical connection to a field device. Additionally, the interface device itself includes a circuit arrangement according to the invention. In principle, and in place of a field device, this interface device can also be connected to one of the conventional interface devices described above, for example, a valve driver.

BRIEF DESCRIPTION OF THE DRAWINGS

Further advantages and characteristics of the invention are described below with reference to the attached diagrammatic drawings.

As a rule, identical and identically functioning components are designated by means of the same reference numerals in the drawings.

DETAILED DESCRIPTION

Figure 1:
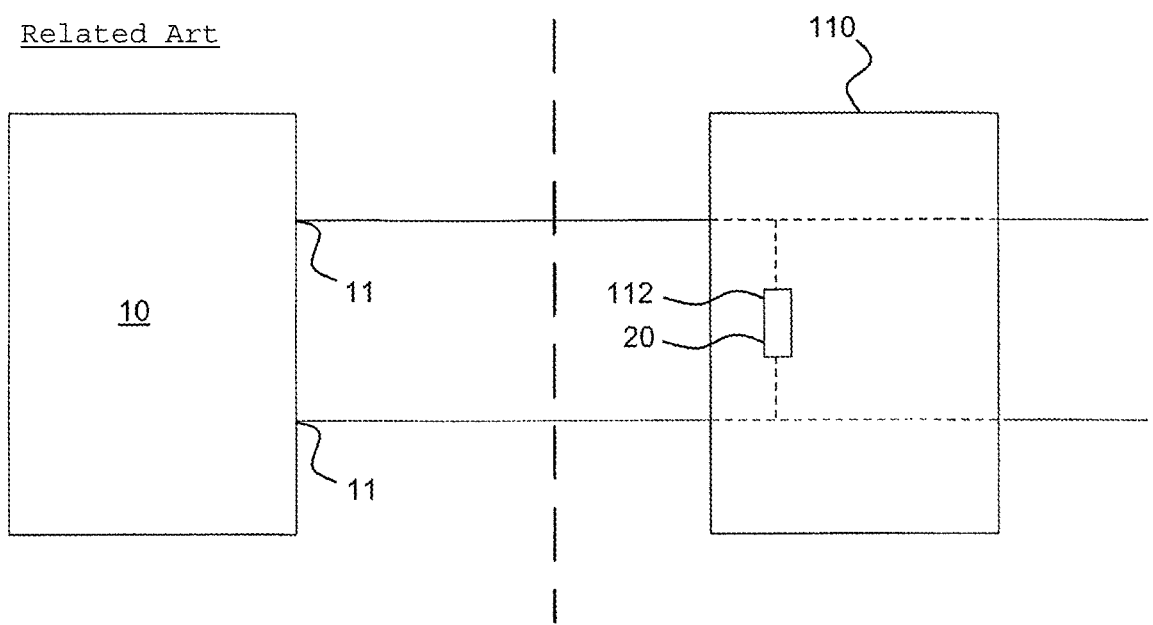
FIG. 1 shows a control system and a conventional circuit arrangement.

FIG. 1 is a diagrammatic depiction of a control system 10 and a conventional circuit arrangement 110 connected thereto.

The control system 10 can alternatively be termed a process control system (PCS). It includes an output 11, which is in this case formed by two electronic plug-in connections 11. To this here can be connected a field device. By "field device" is meant any arbitrary electrical appliance which can send signals to the control system, which can receive signals from the control system, or which receives its energy via the output of the control system. An interface device and/or a circuit arrangement can also be interconnected at the output 11, with a field device attached thereto.

In order to determine the presence of, the compatibility of, or correct functioning of, a connected field device, the control system has in addition a diagnostic system (not illustrated). The diagnostic system produces an electronic test signal at the output 11. Furthermore, the diagnostic system measures an electrical response at output 11, that is to say, the voltage and/or the current at that output 11. This response depends on the connected field device and thus provides information on this device. If a voltage response at the output of the control system lies outside a voltage expectancy range, or if a current response lies outside a current expectancy range, the diagnostic system will emit an error signal. This demonstrates that no proper field device is connected.

However, in the case of complex field devices or interface devices, the voltage and/or current response frequently lies outside the expectancy range, although the device is functioning correctly.

For this reason an additional circuit arrangement can be used at the output of the control system. This circuit arrangement has a voltage influencing means, which, on the occurrence of a test signal, produces a current and/or a voltage at the output 11, such that the current and/or voltage lie within the expectancy range. This avoids the erroneous generation of an error signal.

In FIG. 1, a conventional circuit arrangement 110 is connected to the output 11. This circuit arrangement 110 has, as a voltage influencing system 20, a resistor 112. This is connected to output 11 parallel to a connectable field device.

When a field device, connected in parallel to the resistor 112, is in a switched-off state, a test signal or a test current can pass through the resistor 112. To avoid high energy losses when the field device is switched on, the resistor 112 cannot have an arbitrarily low resistance value. Because of this, however, the resistor 112 cannot produce a voltage and/or current response required by a diagnostic system that expects a load of very low impedance.

Figure 2:
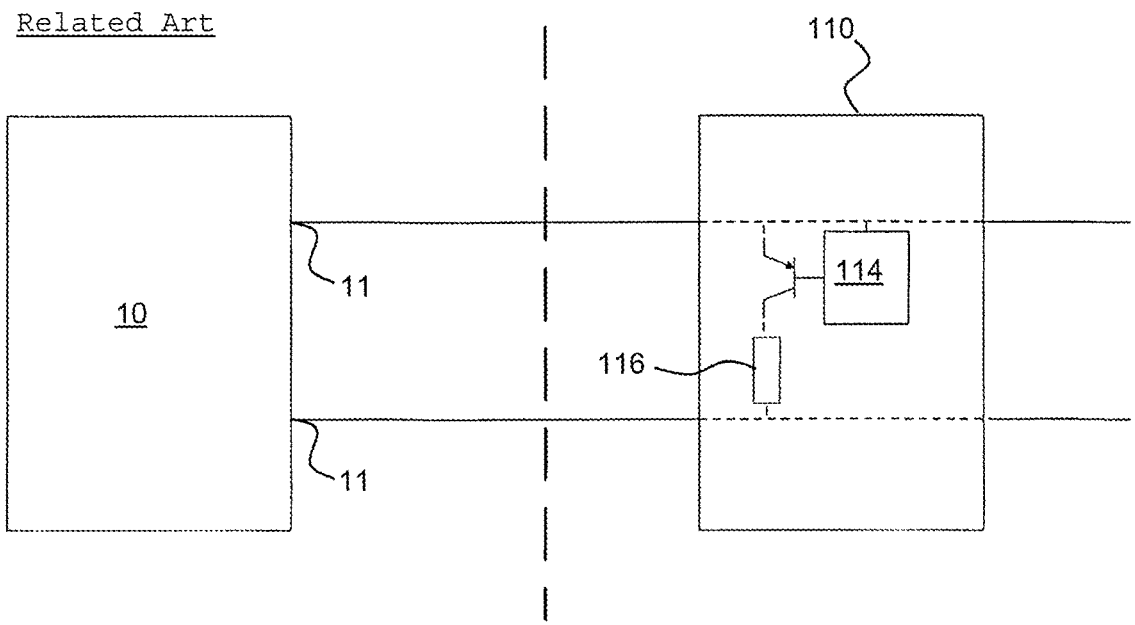
FIG. 2 shows a control system and a further conventional circuit arrangement.

FIG. 2 shows, diagrammatically, a control system 10 with another conventional circuit arrangement 110. This circuit arrangement 110 includes a control unit 114. By means of the base of a transistor, the control unit 114 can cause a short circuit at the output 11 by the use of a resistor 116 of, say, 500 Ohms across the two connectors of the output 11. In this way, the electrical loading of the test impulse can flow away quickly across the resistor 116 and the voltage at the output 11 falls quickly. This achieves compatibility with certain dynamic tests. However, this does not achieve compatibility with all dynamic tests and also not with static tests.

Also, a circuit arrangement including the components of both circuit arrangements 110 shown in FIGS. 1 and 2 is only capable of establishing compatibility with comparatively few static and dynamic tests.

Figure 3:
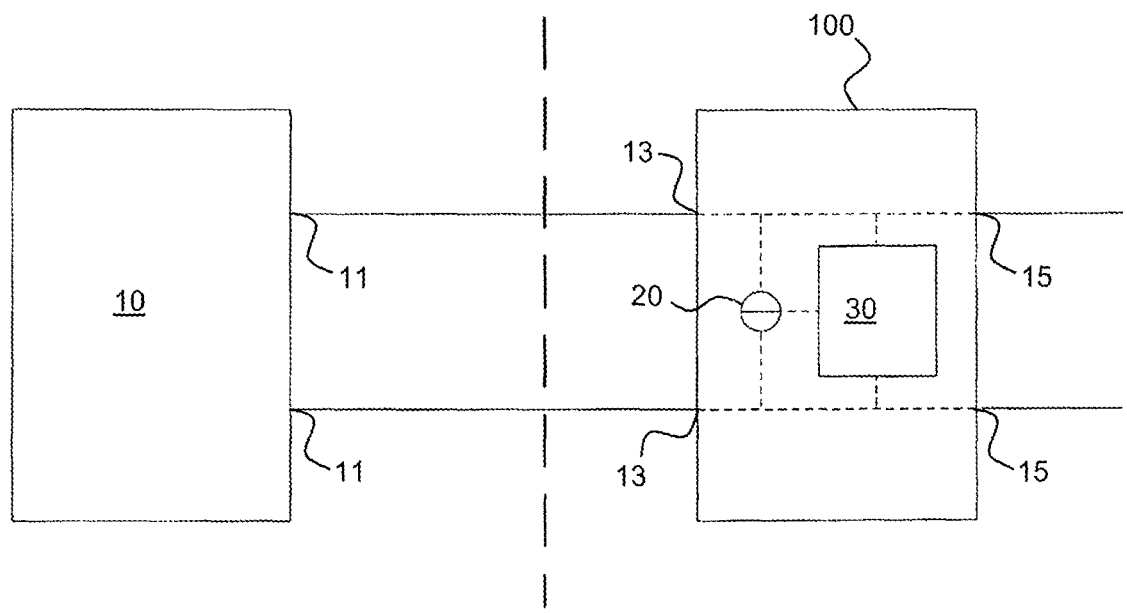
FIG. 3 shows a control system and an exemplary embodiment of a circuit arrangement according to the invention.

This problem is overcome by means of an interface device 100 of the invention, which is shown diagrammatically in FIG. 3, together with a control system 10. The interface device 110 includes first means of connection 13, which can be connected to the output 11 of the control system 10. Furthermore, the interface device 100 has second means of connection 15, to which a field device or another interface device differing from the interface device 100 of the invention can be connected.

The interface device 100 comprises voltage influencing means 20 and electronic analyzing and controlling means 30. The analyzing and controlling means 30 detect voltage and/or current at the output 11. Using predetermined criteria, the analyzing and controlling means 30 can recognize a test signal from the measured voltage and/or current, which test signal is emitted by the diagnostic system at the output 11.

As soon as the analyzing and controlling means 30 recognize a test signal, they instruct or trigger the controllable current source 20 to produce a current, which flows between the two connections of the output 11. In this way a current and a voltage are configured at the output 11. The analyzing and controlling means thus produce a given target voltage and/or a given target current at the output 11. The target voltage or the target current is provided in such a manner that they lie within the expectancy range of the diagnostic system.

This makes it possible to avoid the emission of an error signal for a connected field device that is in fact functioning properly. Advantageously, target voltages and/or target currents can be provided for basically different types of test signal.

The analyzing and controlling means 30 can also provide different target voltages and/or target currents for various kinds of test signals. The current source 20 is then instructed in different ways depending on the recognized type of test signal.

A current produced by the current source 20 flows in a circuit path disposed parallel to a field device connectable to the second connecting means 15. Provision can be made for the analyzing and controlling means 30 to recognize when a field device is connected to the second means of connection and switched off, and only in this case will the analyzing and controlling means 30 trigger the current source 20.

Figure 4:
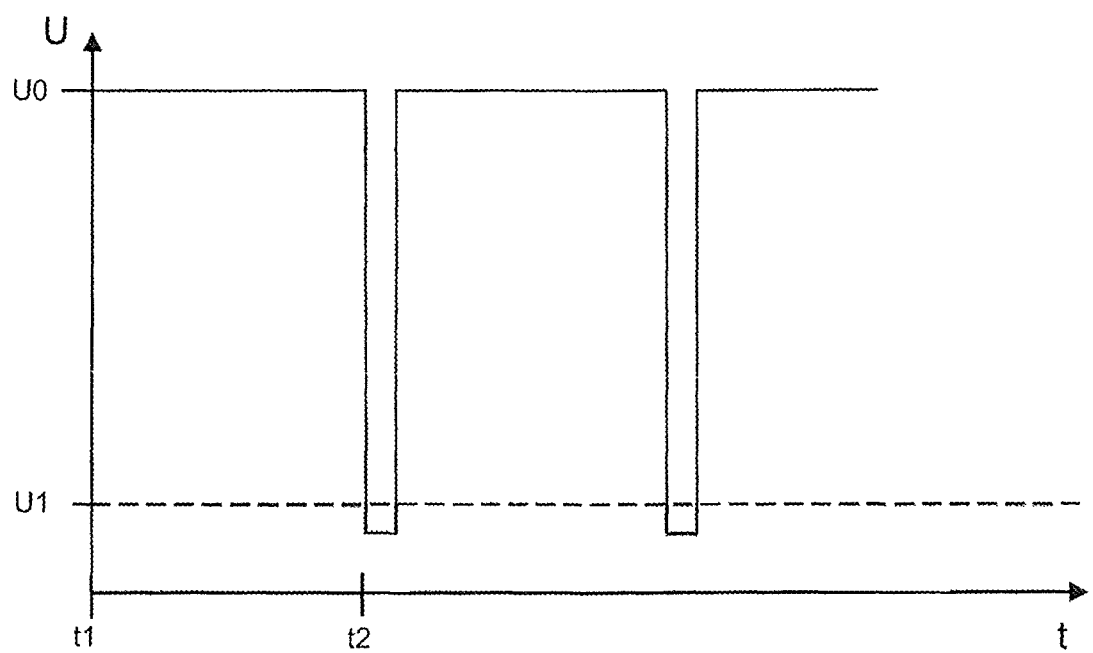
FIG. 4 shows a diagnostic function of a control system.
Figure 5:
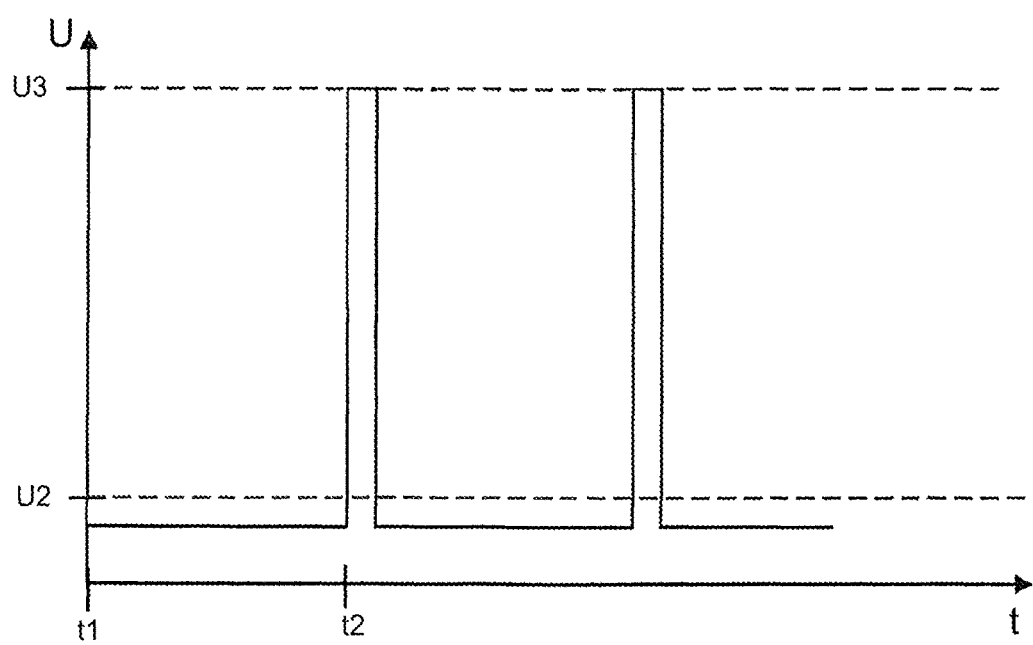
FIG. 5 shows another diagnostic function of a control system.

FIG. 4 and FIG. 5 each show test signals for dynamic tests carried out by a diagnostic system of a control system. These figures each show a graph, in which a voltage U at the output of the control system is plotted against time t.

FIG. 4 shows test signals for a switched-on state, where, in particular at time t1, a supply voltage U0 is emitted at the output of the control system. This can serve to supply the power necessary for a connected field device and, for example, can be equal to 24 V.

At time t2 a test signal is emitted at the output. To this end the impedance at the output of the control system is briefly raised. In response, the voltage at the output falls. This voltage decrease is evaluated by the diagnostic system. The voltage expectancy range expected for a properly functioning field device has an upper voltage limit U1. If the voltage falls below the voltage limit U1 within a certain period of time, the diagnostic system assumes that a properly functioning device is present. Otherwise, it emits an error signal.

In the example illustrated in FIG. 4, the voltage drop is approximately vertical, that is to say, the voltage instantaneously falls below the voltage limit U1. However, this voltage drop still requires a certain amount of time. If there is still no drop to below the upper voltage limit U1 within a given period of time following the commencement of the test signal, an error signal is emitted.

As illustrated in FIG. 4, another test signal is emitted following a given time interval after the test signal at time t2. For example, a test signal can be emitted every 500 milliseconds, for which there is a switch between low impedance and high impedance for a duration of 200 microseconds at the output.

FIG. 5 shows a situation where a test signal of a dynamic test is emitted in a switched-off state. Here, as such, at time t1, a voltage at the output is not the supply voltage U0, but rather one equal to a value below a voltage threshold U2 and more particularly one equal to 0 V.

At time t2 a test signal is produced. To this end, the output is briefly activated, or switched to low impedance and then to high impedance. By switching the output to low impedance, the voltage at the output jumps within a short time to a value in the range of the supply voltage U0. When the output is again switched to high impedance, the voltage at the output falls again within a short period of time.

For the purposes of the test carried out by the diagnostic system, two voltage limits should be crossed. Within a predetermined period of time following the activation of the output, for example within a period of 100 µs, a voltage limit U3 should be exceeded. This predefined limit is in the range of the supply voltage U0. Furthermore, within a predetermined period of time, once the output has been switched to high impedance again, the voltage should fall to below the voltage limit U2.

If any one or both of these conditions is/are not fulfilled, the diagnostic system emits an error signal.

The analyzing and controlling means 30 detect changes in voltage or in current at the output 11, which changes are invoked by a test signal. For this purpose, for example only 15 µs are necessary. The current source 20 is subsequently instructed to the effect that a required voltage value which is above U3 and below U2 is set within a very short period of time, more particularly within 100 µs. By this means, it is possible to avoid the erroneous generation of an error signal.

It is possible for a test current in a static test to be simultaneously emitted during the test impulse of the dynamic test, as illustrated in FIG. 4 and FIG. 5. The circuit arrangement of the invention can simultaneously produce suitable voltage and current values for both tests at the output.

One advantage of the current source resides in the particularly short time necessary to achieve a change in voltage at the output. In this way, currents of different magnitude and duration can be produced so as to establish compatibility with different tests. Finally, energy losses are also low compared with conventional circuit arrangements.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

The invention claimed is:

1. An interface device for connecting a control system to a field device or to another interface device for a field device, the interface device comprising:
   first connecting means for the establishment of an electrical connection with a control system and for receiving of a test signal emitted by a diagnostic system of the control system,
   second connecting means for the establishment of an electrical connection to the field device or the other interface device of a field device,
   wherein the interface device comprises a circuit arrangement for establishing compatibility between the field device or the other interface device and the diagnostic system of the control system,
   wherein the circuit arrangement comprises a voltage influencing means for influencing a voltage at an output of the control system,
   wherein the voltage influencing means comprises a controllable current source,
   wherein the circuit arrangement comprises electronic analyzing and controlling means which are adapted to identify a test signal at the output of the control system based on a measurement of a voltage at the output of the control system and/or a measurement of a current at the output of the control system, and, on identification of a test signal, to instruct the controllable current source to adjust a target voltage at the output of the control system, and
   wherein, at a properly functioning field device, the controlled target voltage is within an expectancy range of the diagnostic system.

2. The interface device as defined in claim 1, wherein the electronic analyzing and controlling means are adapted to identify a test signal based on a measurement of an intensity of the current, a change in the current intensity, a level of the voltage, and/or a change in the voltage level at the output of the control system.

3. The interface device as defined in claim 1, wherein the electronic analyzing and controlling means are capable of evaluating a result of the measurement by implementation of a set of predetermined criteria, in order to differentiate between various types of test signal.

4. The interface device as defined in claim 1, wherein the electronic analyzing and controlling means are adapted to set an intensity and/or duration of a current generated by the power source at different values for various types of test signal.

5. The interface device as defined in claim 4, wherein the electronic analyzing and controlling means are adapted to recognize, using a set of specified criteria, a plurality of simultaneous test signals of different types and to instruct the power source in accordance with the simultaneously recognized test signals.

6. The interface device as defined in claim 1, wherein a set of criteria of the electronic analyzing and controlling means can be set variably for the purpose of identifying a test signal.

7. The interface device as defined in claim 6, wherein the electronic analyzing and controlling means comprise a microcontroller, by means of which criteria for identifying a test signal can be set variably and an intensity and/or duration of a current generated by the power source can be set variably.

8. The interface device as defined in claim 1, wherein the electronic analyzing and controlling means are adapted to identify a switched-off state of a connected field device and, when a switched-off state is identified, to instruct the controllable power source to adjust the target voltage and/or to generate a current of specified intensity.

9. The interface device as defined in claim 1, wherein the electronic analyzing and controlling means are adapted to obtain their energy requirements for issuing instructions to the controllable power source from current impulses of test signals.

10. A method for establishing compatibility between a field device or an interface device for a field device and a diagnostic system pertaining to a control system, to the output of which the interface device or field device is connected,
   in which the diagnostic system sends a test signal to the interface device or field device via the output of the control system and emits an error signal when an electrical response at the output of the control system is outside of an expectancy range, and with which a voltage at the output of the control system is influenced by means of a voltage influencing means, the voltage influencing means comprising a controllable current source, wherein a test signal of the diagnostic system at the output of the control system is identified by electronic analyzing and controlling means based on a measurement of a voltage at the output of the control system and/or a measurement of a current at the output of the control system, and
   wherein, on identification of a test signal, the controllable current source is driven by the analyzing and controlling means to set a target voltage at the output of the control system, wherein, at a properly functioning field device, the controlled target voltage is within the expectancy range of the diagnostic system.

* * * * *